(12) United States Patent
Priel et al.

(10) Patent No.: US 8,228,080 B2
(45) Date of Patent: Jul. 24, 2012

(54) DEVICE AND METHOD FOR CURRENT ESTIMATION

(75) Inventors: Michael Priel, Hertzelia (IL); Leonid Fleshel, Hertzelia (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 549 days.

(21) Appl. No.: 12/509,279

(22) Filed: Jul. 24, 2009

(65) Prior Publication Data

US 2011/0018523 A1    Jan. 27, 2011

(51) Int. Cl.
*G01R 31/02* (2006.01)
*G05F 3/02* (2006.01)
*H01L 23/58* (2006.01)
*G06F 1/26* (2006.01)

(52) U.S. Cl. .......... 324/713; 324/762.01; 327/544; 257/48; 713/320

(58) Field of Classification Search .......... 324/691–724, 324/751.01–764.01; 327/365, 368, 376, 327/377, 544; 713/320–324; 702/64, 764; 361/30, 31, 33, 79; 257/48
See application file for complete search history.

(56) References Cited

U.S. PATENT DOCUMENTS

| | | | |
|---|---|---|---|
| 5,787,092 | A | 7/1998 | Jaynes et al. |
| 7,324,914 | B2 | 1/2008 | Jain et al. |
| 2007/0069736 | A1 | 3/2007 | Sharivastav et al. |
| 2008/0169822 | A1 | 7/2008 | Kwak |
| 2010/0109633 | A1* | 5/2010 | Sofer et al. .......... 323/313 |

\* cited by examiner

Primary Examiner — Melissa Koval
Assistant Examiner — Farhana Hoque

(57) ABSTRACT

A device and a method for estimating a current; the method includes: setting an impedance of a power gating circuit to a measurement value; wherein the power gating circuit selectively provides power to a circuit of an integrated circuit; measuring, during a measurement period, an electrical parameter indicative of a current that flows through the power gating circuit; and reducing an impedance of the power gating circuit to a power provision value to reduce a voltage developed on the power gating circuit during a power provision period.

20 Claims, 5 Drawing Sheets

10

DEVICE AND METHOD FOR CURRENT ESTIMATION

FIELD OF THE INVENTION

This disclosure relates generally to devices and to methods for current estimation.

BACKGROUND OF THE INVENTION

During the last decades various techniques were developed in order to reduce the power consumption of integrated circuits. One of these techniques is known as power gating. Power gating involves selectively providing power to a circuit of the integrated circuit. A power gating circuit is connected between a gated power grid and a circuit of the integrated circuit. During a power gating period the circuit is disconnected from the gated power grid and its power consumption is drastically reduced. During an operational period the power supply circuit is open and provides power to the circuit. In order to minimize power loss (also known as IR drop) during the operational period the impedance of the power supply circuit should be as low as possible.

The design of a integrated circuit and, additionally or alternatively, the manner in which the integrated circuit assets are being used can be affected by the current consumption of various circuits of the integrated circuit. Current measurement of circuits of a integrated circuit can assist in evaluating the performance of the various circuits of the integrated circuit and can be helpful during integrated circuit software validation and development stages. Circuits can be re-designed and additionally or alternatively, software that uses the circuit can be re-programmed in view of the power consumption of the circuit.

The overall current drained by a integrated circuit can be evaluated by probing the external pins of the integrated circuit. This evaluation does not shed light on the current consumed by different circuits of the integrated circuit.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It has been shown that current that is drained by a circuit of an integrated circuit can be evaluated by measuring an electrical parameter such as the voltage that is developed on a power gating circuit that is adapted to provide power to that circuit. The impedance of the power gating circuit could be kept low during operational mode but can be increased during measurement periods. The increased impedance can assist in developing an easily measured voltage over the power gating circuit.

Figure 1:
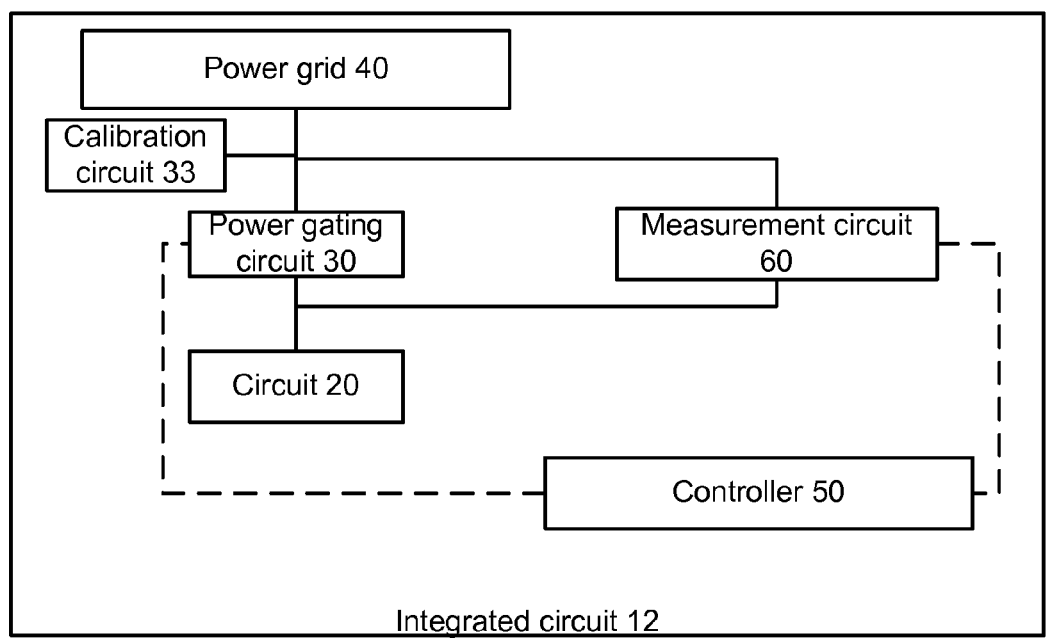
FIG. 1 schematically shows an example of an embodiment a device.

FIG. 1 schematically shows an example of an embodiment of device 10. Device 10 can include at least one integrated circuit or be an integrated circuit. Device 10 can be a mobile device, a cellular phone, a media player, a smart phone, a personal data assistant, a printed circuit board, a medical device, a battery powered device, a laptop computer, a micro computer, and the like.

FIG. 1 illustrates device 10 as including integrated circuit 12. Integrated circuit 12 includes multiple circuits such as but not limited to circuit 20. Different circuits can belong to different frequency domains but this is not necessarily so. Circuit 20 includes at least one hardware component and can be a memory bank, a group of flip-flops, a processor, a core, a digital signal processor, a hardware accelerator, and the like. Circuit 20 can be an internal circuit of integrated circuit 12 in the sense that its current consumption is not directly measurable from outside the integrated circuit. Circuit 20 can receive power via an input junction that is not directly connected to an external pin of integrated circuit 12.

Circuit 20 selectively receives power via power gating circuit 30. Power gating circuit 30 can be in a non-conductive state and not provide power to circuit 20 and can be in a conductive state and provide power to power gating circuit. Power gating circuit is in a non-conductive state during power gating periods and is in a conductive state during a power provision period.

FIG. 1 illustrates power gating circuit 30 as receiving power from power grid 40. It is noted that power gating circuit 30 can receive power from pins of an integrated circuit, and additionally or alternatively receive power directly from an external power supply.

Power gating circuit 30 has a non-constant, configurable impedance. As illustrated below the impedance can be changed by controller 50. Controller 50 can reduce the impedance of power gating circuit during power provision periods (when circuit 20 operates in a so called operational mode) and can increase the impedance of the power gating circuit to one or more higher values during measurement periods.

Controller 50 can set the impedance of the power gating circuit 30 to either one or one or more measurements value during a measurement period. Controller 50 can also set the impedance of the power gating circuit 30 to a power provision value. The power provision value is lower and even much lower than the measurement value and can be minimized in order to reduce the power loss resulting from a provision of power to circuit 20 via power gating circuit 30 during power provision periods. The power provision value can be a fraction and even a small fraction of a measurement value.

Measurement circuit 60 of device 10 measures, during a measurement period, an electrical parameter indicative of a current that flows through the power gating circuit.

The electrical parameter can be measured at one or more points in time of the measurement period. Different measurements can be obtained while the impedance of the power gating circuit remains the same but these measurements can be obtained at different impedance values. Measuring circuit 60 can obtain multiple measurement results and then process them, for example by averaging or weighted averaging.

Measurement circuit 60 can measure a voltage developed on power gating circuit 30. It can be connected in parallel to measurement circuit 60 and measure this voltage. Alternatively, measurement circuit 60 can measure the output voltage that is outputted from power gating circuit 30 and it (or another component of device 10) can compare the output voltage to the voltage provided by the power grid 40. Alternatively, measurement circuit 60 can measure the current that flows through the power gating circuit 20 and in this case it should be serially connected to power gating circuit 20. It is noted that FIG. 1 illustrates the former configuration and not the latter configuration.

Device 10 can also has a calibration circuit such as calibration circuit 33 that is illustrated in FIG. 1 as being connected to power gating circuit 30. Calibration circuit 33 provides a known current to power gating circuit 30 and allows measurement circuit 60 to measure the voltage developed over power gating circuit and hence determine the impedance of power gating circuit 30. Calibration circuit 30 is used during a calibration session and is usually shut down during normal operation of device 10. It is noted that other calibration circuits can be provided.

Figure 2:
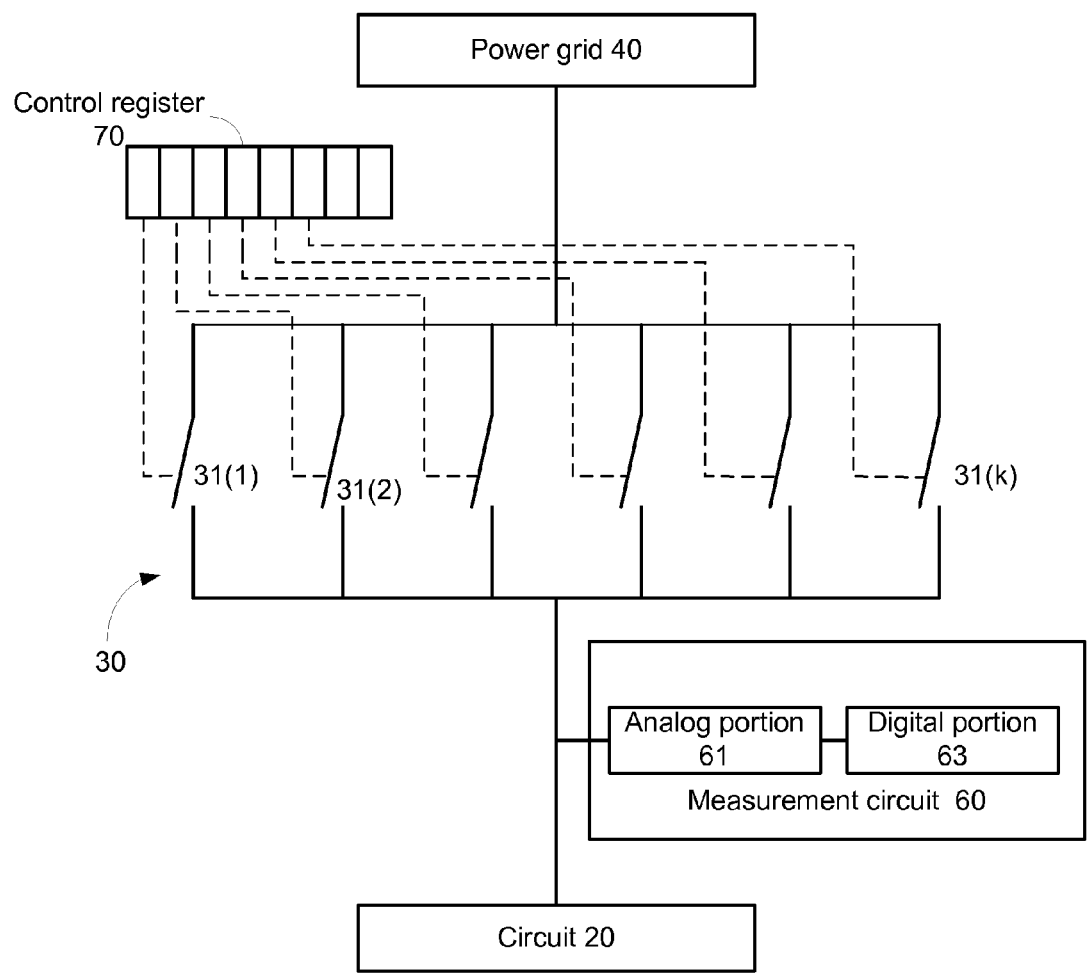
FIG. 2 schematically shows an example of an embodiment of a power gating circuit.

FIG. 2 schematically shows an example of an embodiment of power gating circuit 30.

Power gating circuit 30 includes multiple switches 31(1)-31(k) that are connected in parallel between power grid 40 and circuit 20.

Each switch or each group of switches can be controlled (select between a conductive state and a non-conductive state), directly or indirectly, by controller 50. The number of switches within each group can provide a tradeoff between controllability (less switches per group) and simplicity (more switches per group). A switch is "open" when it is in a conductive state and is closed when it is a non-conductive state.

The number of switches can differ from one group of switches to another but this is not necessarily so. For example—all groups of switches can include the same number of switches. Two of more groups of switches can include the same number of switches while other groups of switches can have a different number of switches.

The number of switches per group can be equal to a power of a certain integer (the integer can be two but this is not necessarily so) and different groups of switches can include different power of that certain integer. Binary weighted groups can simplify the control scheme of the switches.

An impedance of a switch can differ from one switch to another (or from one group of switches to another) but this is not necessarily so. Different groups of switches can include switches that differ from each other by their impedance.

Controller 50 can control switches 31(1)-31(k) in different manners. For example, it can write a control vector to control register 70. The control vector can indicate which switch (or group of switches) to open and which switch (or group of switches) to close. Lower impedances can be achieved by opening more switches, opening switches with lower impedance or a combination thereof. Switches 31(1)-31(k) can be transistors that receive a gate signal that opens them or closes them.

During the measurement period the impedance of power gating circuit 30 is higher then its value during a power provision period. This can be achieved by opening at least one switch that was closed during the measurement period.

Measurement circuit 60 measures signals and can provide an analog measurement result or a digital measurement result. Digital measurement results are easier to output from integrated circuit 12. Measurement circuit 60 can include an analog portion 61 and a digital (or rather mixed signal) portion 63. The analog portion 61 can provide an analog signal that is indicative of a voltage developed on the power gating circuit during the measurement period. The digital portion 63 converts the analog signal to a digital result that can be outputted to other components of integrated circuit 12 or even outputted from integrated circuit 12. The digital conversion of the analog signal can be performed by a component of device 10 that is not illustrated in FIG. 2.

Figure 3:
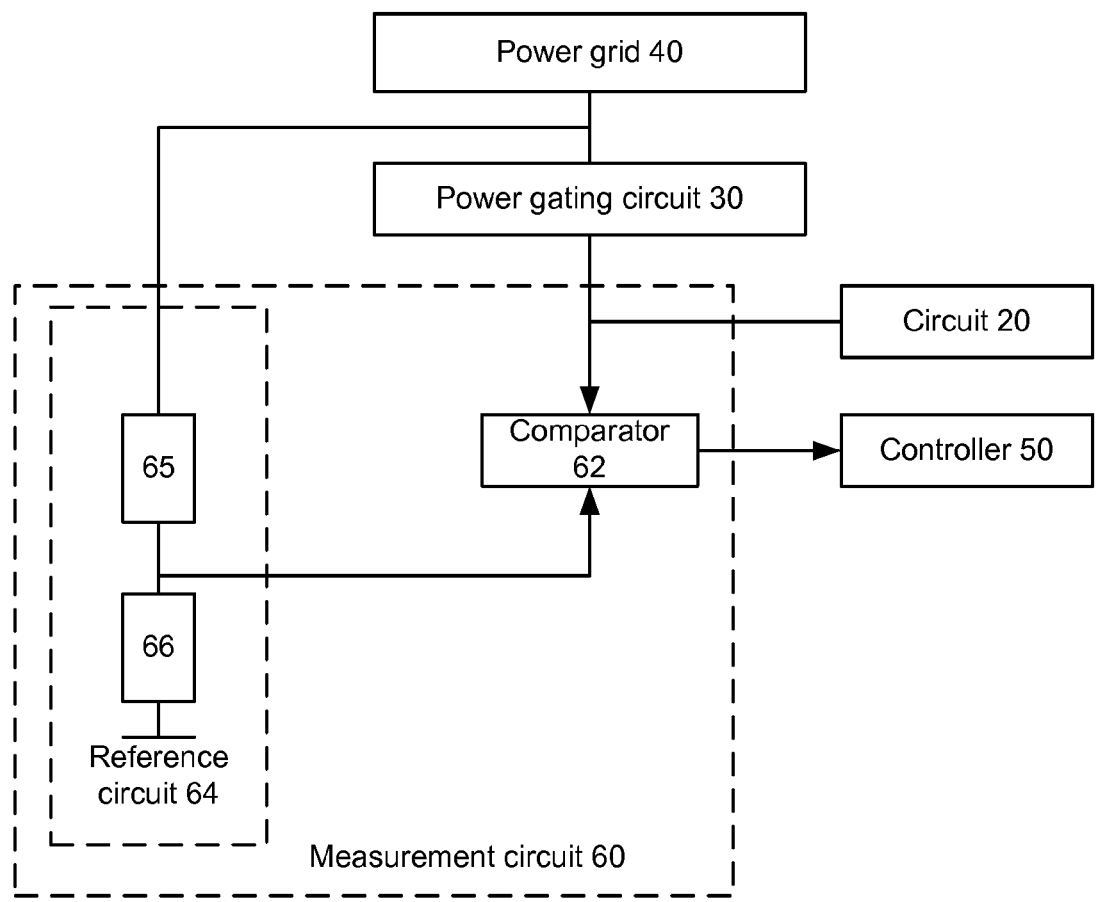
FIG. 3 schematically shows an example of an embodiment of a measurement circuit.

FIG. 3 schematically shows an example of an embodiment of measurement circuit 60.

Measurement circuit 60 includes comparator 62 that generates a comparison result by comparing between an analog reference voltage and a measured analog voltage that is indicative of a voltage developed on power gating circuit 30 during the measurement period. FIG. 3 illustrates a measured voltage that is an output voltage that is outputted by power gating circuit 20. The difference between the voltage supplied by power grid 40 and that output voltage equals the voltage developed on power gating circuit 30.

The analog reference voltage can be provided by reference circuit 64. Reference circuit 64 can be a voltage divider that has a pair of serially connected resistors 65 and 66 that are connected between power grid 40 and the ground. The junction between these resistors serves as an output port of reference circuit. The analog reference voltage is determined by the voltage provided by power grid 40 and the relationship between the impedances of resistors 65 and 66.

Comparator 62 can output a comparison result that indicates whether the measured voltage is greater than the analog reference voltage. The comparison result can be sent to controller 50.

Controller 50 can repetitively change a value of the impedance of power gating circuit 30 and measurement circuit 60 can repetitively provide an indication of the current that flows through power gating circuit 20 until a control criterion is fulfilled.

The control criteria can be fulfilled when a voltage developed on power gating circuit 30 is above (or below) a voltage threshold (or equals the voltage threshold), when a number of repetitions reaches a repetition threshold, when the impedance of the power gating circuit 30 is above an impedance threshold or a combination thereof.

Controller 50 can change the impedance of power gating circuit 30 by increasing the value of the impedance of power gating circuit 30—in this case the control criteria can be fulfilled when an impedance of the power gating circuit 30 is above an impedance threshold. Additionally or alternatively, controller 50 can decrease the resistance until it is below a resistance threshold.

Accordingly, controller 50 can change the impedance of power gating circuit 30 until measurement circuit 60 can provide a relatively reliable measurement result or until another measurement quality criterion or measurement probability criterion is fulfilled. Measurement circuit 60 can have a voltage measurement range and the changes in the impedance of power gating circuit 30 can be aimed to include the measured voltage in this range.

The reliability, quality or probability of a measurement result can be affected by signal to noise ratio, measurement circuit 60 sensitivity and the like. Typically, is it harder to provide a reliable measurement of small and even very small voltage. Additionally or alternatively, high voltage levels can also result in measurement problems such as saturation of measurement circuit 60 and the like.

By increasing or otherwise altering the impedance of power gating circuit 30 higher voltage levels within a desired measurement range can be developed on power gating circuit 30 and the reliability of the measurement result increases.

The impedance of power gating circuit 30 can be raised in various manners. For example—it can be raised in a gradual manner, in response to an expected current drained by circuit 20, can be raised in bursts, in a liner manner, in a non-linear manner and the like. The impedance of power gating circuit 30 can be changed in order to converge towards a certain value. The changes in the impedance can be smaller as the iterative process proceeds. It is noted that impedance increments can be followed by impedance decrements.

Controller 50 can change the impedance of power gating circuit 30 until comparator 62 indicates that the analog reference voltage is smaller than the measured analog voltage. At this point the current drained by circuit 20 is evaluated by dividing the analog reference voltage by the impedance of the power gating circuit 30. The impedance is estimated from the current configuration of power gating circuit 30—especially which switches are open.

Referring back to FIG. 1, device 10 can have multiple circuits that are connected to multiple power gating circuits. The multiple power gating circuits can be independently controlled by one or more controllers of device 10.

Figure 4:
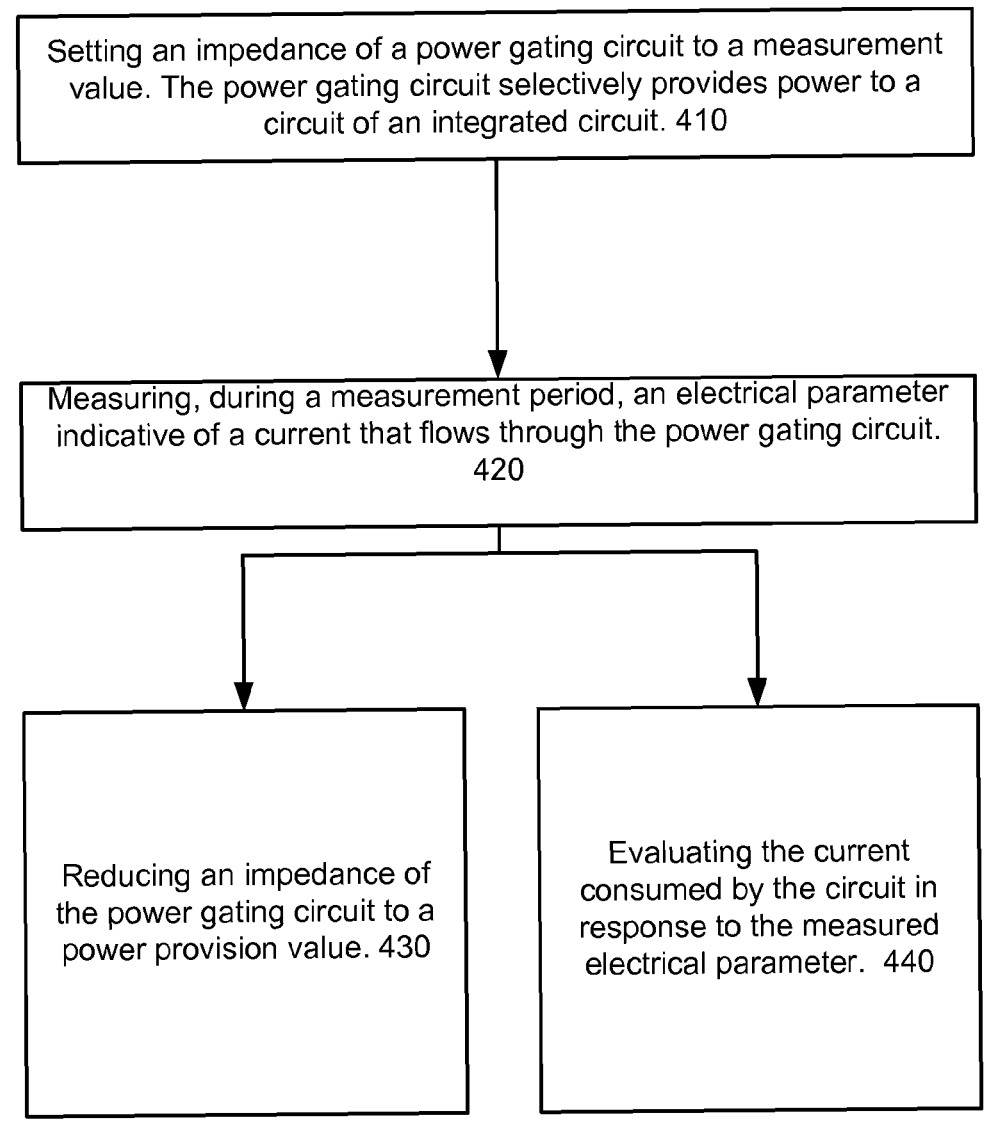
FIG. 4 schematically shows an example of an embodiment of a method for evaluating a current.

FIG. 4 schematically shows an example of an embodiment of method 400 for evaluating a current.

Method 400 starts by stage 410 of setting an impedance of a power gating circuit to a measurement value. The power gating circuit selectively provides power to a circuit of an integrated circuit.

Stage 410 is followed by stage 420 of measuring, during a measurement period, an electrical parameter indicative of a current that flows through the power gating circuit.

Stage 420 can include measuring a voltage developed on the power gating circuit during the measurement period. Additionally or alternatively, stage 420 can include measuring the current that flows through the power gating circuit.

Stage 420 can include providing an analog signal that is indicative of a voltage developed on the power gating circuit during the measurement period, and converting the analog signal to a digital result and outputting the digital result.

Stage 420 can include generating a comparison result by comparing between an analog reference voltage and a measured analog voltage that is indicative of a voltage developed on the power gating circuit during the measurement period.

Stage 420 is followed by stages 430 and 440.

Stage 430 includes reducing an impedance of the power gating circuit to a power provision value. This can reduce a voltage developed on the power gating circuit during a power provision period.

The power gating circuit can include multiple switches that are connected in parallel between a power grid and the circuit. Stage 430 can include reducing the impedance of the power gating circuit by opening at least one switch that was closed during the measurement period. Additionally or alternatively, stage 430 can include altering an impedance of one or more switches.

Stage 440 includes evaluating the current consumed by the circuit in response to the measured electrical parameter. It can include calculating the current in response to a voltage developed over the power gating circuit and to an impedance of the power gating circuit.

Method 400 can include multiple repetitions of stage 420 to obtain multiple measurements while the impedance of the power gating circuit remains unchanged. These measurement results can be processed in various manners such as averaging or weighted averaging.

Method 400 can include multiple repetitions of stage 420 whereas the value of the impedance of the power gating circuit is changed between iterations. The iterations can be repeated until a control criterion is fulfilled. The fulfillment of the control criterion can be evaluated during a control evaluation stage.

Figure 5:
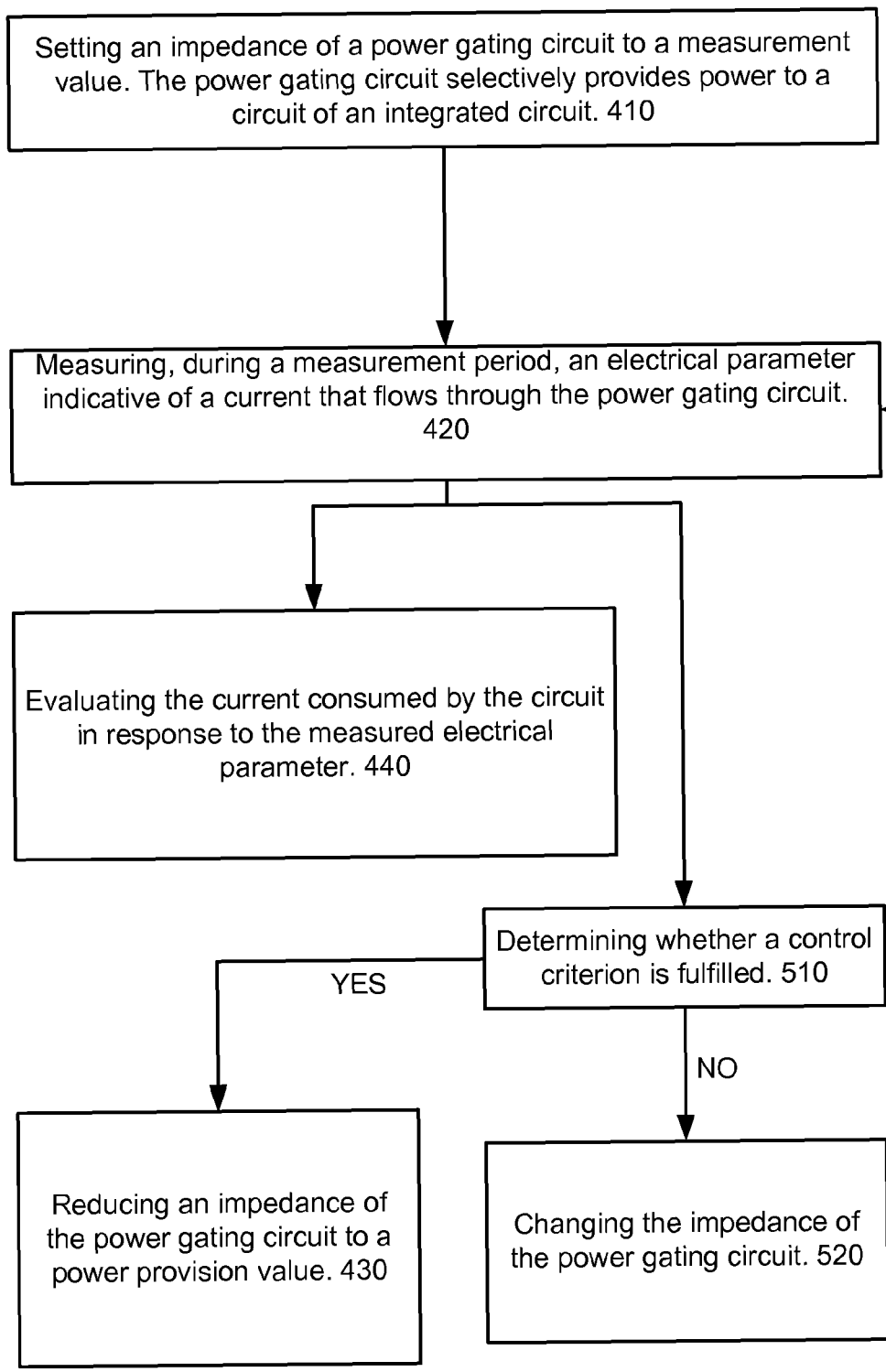
FIG. 5 schematically shows an example of an embodiment of a method for evaluating a current.

FIG. 5 schematically shows an example of an embodiment of method 500 for evaluating a current.

Method 500 includes repetitively changing a value of the impedance of the power gating circuit (during stage and providing an indication of the current that flows through the power gating circuit until a control criterion is fulfilled. The control criteria can be fulfilled when a voltage developed on the power gating circuit is above a voltage threshold, when a number of repetitions reach a repetition threshold, when the impedance of the power gating circuit is above an impedance threshold and a combination thereof.

Method 500 starts by stage 410 of setting an impedance of a power gating circuit to a measurement value. The power gating circuit selectively provides power to a circuit of an integrated circuit.

Stage 410 is followed by stage 420 of measuring, during a measurement period, an electrical parameter indicative of a current that flows through the power gating circuit.

Stage 420 is followed by stages 440 and 510.

Stage 440 includes evaluating the current consumed by the circuit in response to the measured electrical parameter. It can include calculating the current in response to a voltage developed over the power gating circuit and to an impedance of the power gating circuit.

Stage 510 is also referred to as a control evaluation stage. It includes determining whether a control criterion is fulfilled. If the control criterion is fulfilled method 500 can end (continue to stage 430), else—method 500 can continue to stage 520 during which the impedance of the power gating circuit is changed and stage 420 of performing another measurement of the electrical parameter that is indicative of a current that flows through the power gating circuit.

Either one of methods 400 and 500 can be applied in a multiple circuit scenario in which the integrated circuit includes multiple circuits and wherein each circuit is coupled to a dedicated power gating circuit. The method can include independently setting impedances of the different power gating circuits; independently measuring electrical parameters indicative of currents that flow through the power gating circuit; and independently reducing impedances of the different power gating circuits.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. Any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for estimating a current; the method comprises:
   setting an impedance of a power gating circuit to a measurement value; wherein the power gating circuit selectively provides power to a circuit of an integrated circuit;
   measuring, during a measurement period, an electrical parameter indicative of a current that flows through the power gating circuit; and
   reducing an impedance of the power gating circuit to a power provision value to reduce a voltage developed on the power gating circuit during a power provision period.

2. The method according to claim 1 wherein the power gating circuit comprises multiple switches that are coupled in parallel between a power grid and the circuit; wherein the reducing of the impedance comprises opening at least one switch that was closed during the measurement period.

3. The method according to claim 1 comprising measuring a voltage developed on the power gating circuit during the measurement period.

4. The method according to claim 1 comprising providing a signal that is indicative of a voltage developed on the power gating circuit during the measurement period, converting the signal to a digital result and outputting the digital result.

5. The method according to claim 1 comprising generating a comparison result by comparing between a reference voltage and a measured voltage that is indicative of a voltage developed on the power gating circuit during the measurement period.

6. The method according to claim 1 comprising repetitively changing a value of the impedance of the power gating circuit and providing an indication of the current that flows through the power gating circuit until a control criterion is fulfilled.

7. The method of claim 6 wherein the control criteria is fulfilled when a voltage developed on the power gating circuit is above a voltage threshold.

8. The method of claim 6 wherein the changing comprises increasing the value of the impedance of the power gating circuit and wherein the control criteria is fulfilled when an impedance of the power gating circuit is above an impedance threshold.

9. The method of claim 6 wherein the control criteria is fulfilled when a number of repetitions reaches a repetition threshold.

10. The method according to claim 1 wherein the integrated circuit comprises multiple circuits and wherein each circuit is coupled to a dedicated power gating circuit; wherein the method comprises independently setting impedances of he different power gating circuits; independently measuring electrical parameters indicative of currents that flow through the power gating circuit; and independently reducing impedances of the different power gating circuits.

11. A device, comprising:
    a power gating circuit for selectively providing power to a circuit of an integrated circuit of the device;
    a controller for setting an impedance of the power gating circuit to a measurement value during a measurement period; and for reducing an impedance of the power gating circuit to a power provision value during a power provision period; and
    a measurement circuit for measuring, during the measurement period, an electrical parameter indicative of a current that flows through the power gating circuit;
    wherein the power gating circuit is coupled to the circuit of the integrated circuit, to the measurement circuit and to the controller.

12. The device according to claim 11 wherein the power gating circuit comprises multiple switches that are coupled in parallel between a power grid and the circuit; wherein the controller is adapted to reduce the impedance of the power gating circuit by opening at least one switch that was closed during the measurement period.

13. The device according to claim 11 wherein the measurement circuit is adapted to measure a voltage developed on the power gating circuit during the measurement period.

14. The device according to claim 11 wherein the measurement circuit is adapted to provide an analog signal that is indicative of a voltage developed on the power gating circuit during the measurement period, and wherein the device is adapted to convert the analog signal to a digital result and output the digital result.

15. The device according to claim 11 wherein the measurement circuit comprises a comparator for generating a comparison result by comparing between an analog reference voltage and a measured analog voltage that is indicative of a voltage developed on the power gating circuit during the measurement period.

16. The device according to claim 11 wherein the controller is adapted to repetitively change a value of the impedance of the power gating circuit and the measurement circuit is adapted to repetitively provide an indication of the current that flows through the power gating circuit until a control criterion is fulfilled.

17. The device of claim 16 wherein the control criteria is fulfilled when a voltage developed on the power gating circuit is above a voltage threshold.

18. The device of claim 16 wherein the controller is adapted to change the impedance of the power gating circuit by increasing the value of the impedance of the power gating circuit and wherein the control criteria is fulfilled when an impedance of the power gating circuit is above an impedance threshold.

19. The device of claim 16 wherein the control criteria is fulfilled when a number of repetitions reaches a repetition threshold.

20. The device according to claim 11 wherein the integrated circuit comprises multiple circuits and wherein each circuit is coupled to a dedicated power gating circuit; wherein the dedicated power gating circuit are mutually independent.

* * * * *